United States Patent
Mohammad (10) Patent No.: US 8,127,184 B2
(45) Date of Patent: Feb. 28, 2012

(54) SYSTEM AND METHOD INCLUDING BUILT-IN SELF TEST (BIST) CIRCUIT TO TEST CACHE MEMORY

(75) Inventor: Baker Mohammad, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 198 days.

(21) Appl. No.: 12/323,932

(22) Filed: Nov. 26, 2008

(65) Prior Publication Data

US 2010/0131812 A1 May 27, 2010

(51) Int. Cl.
*G11C 29/00* (2006.01)
*G01R 31/28* (2006.01)

(52) U.S. Cl. ........................................ 714/723; 714/733

(58) Field of Classification Search .................. 714/710, 714/711, 718, 719, 723
See application file for complete search history.

(56) References Cited

U.S. PATENT DOCUMENTS

| | | | |
|---|---|---|---|
| 5,835,504 A | 11/1998 | Balkin et al. | |
| 5,862,151 A * | 1/1999 | Fagerness | 714/733 |
| 6,199,177 B1 * | 3/2001 | Blodgett | 714/7 |
| 6,243,307 B1 * | 6/2001 | Kawagoe | 365/201 |
| 6,351,789 B1 | 2/2002 | Green | |
| 6,477,672 B1 * | 11/2002 | Satoh | 714/721 |
| 6,496,952 B1 | 12/2002 | Osada et al. | |
| 6,769,081 B1 * | 7/2004 | Parulkar | 714/733 |
| 6,782,499 B2 | 8/2004 | Osada et al. | |
| 6,795,942 B1 * | 9/2004 | Schwarz | 714/718 |
| 6,898,749 B2 | 5/2005 | Whetsel et al. | |
| 6,993,692 B2 * | 1/2006 | Ouellette et al. | 714/723 |
| 7,047,466 B2 * | 5/2006 | Meaney et al. | 714/726 |
| 7,058,864 B1 | 6/2006 | McHardy | |
| 7,137,055 B2 * | 11/2006 | Hirano et al. | 714/738 |
| 7,366,953 B2 | 4/2008 | Huott et al. | |
| 7,406,643 B2 | 7/2008 | Osada et al. | |
| 7,430,145 B2 * | 9/2008 | Weiss et al. | 365/200 |
| 7,627,792 B2 * | 12/2009 | Di Ronza et al. | 714/710 |
| 7,721,163 B2 * | 5/2010 | Fujiwara et al. | 714/710 |
| 7,788,550 B2 * | 8/2010 | Merandat et al. | 714/711 |
| 7,836,362 B2 * | 11/2010 | Marr | 714/711 |
| 2002/0194558 A1 * | 12/2002 | Wang et al. | 714/718 |
| 2003/0226078 A1 | 12/2003 | Meaney | |
| 2005/0086564 A1 * | 4/2005 | Frankowsky et al. | 714/718 |
| 2006/0156130 A1 | 7/2006 | Huott et al. | |
| 2006/0259840 A1 | 11/2006 | Abadeer et al. | |
| 2008/0072121 A1 * | 3/2008 | Lee et al. | 714/768 |

OTHER PUBLICATIONS

International Search Report—PCT/US2009/065884, International Search Authority—European Patent Office Feb. 22, 2010.
Written Opinion—PCT/US2009/065864, International Search Authority—European Patent Office Feb. 22, 2010.

* cited by examiner

*Primary Examiner* — James C Kerveros
(74) *Attorney, Agent, or Firm* — Nicholas J. Pauley; Peter M. Kamarchik; Jonathan T. Velasco (57) ABSTRACT

A resizable cache memory and a system including a Built-In Self Test (BIST) circuit configured to test a cache memory are disclosed. The system further includes a non-volatile storage device including an E-fuse array to store one or more indicators. Each indicator identifies a corresponding memory address of a failed location of the cache memory that has been detected by the BIST circuit.

17 Claims, 6 Drawing Sheets

SYSTEM AND METHOD INCLUDING BUILT-IN SELF TEST (BIST) CIRCUIT TO TEST CACHE MEMORY

FIELD

The present disclosure is generally related to resizable cache memory.

DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Processors employed in any of the above-mentioned applications typically include cache memory. The cache memory can have one or more failed locations, due to manufacturing issues. The cache memory may include redundant memory locations so that when a memory location fails, such as one or more data bits of a cache line, the failed data bits or cache line may be remapped to a redundant location. Adding redundant locations may increase a manufacturing yield, but may also increase a cost of designing and manufacturing the cache memory.

SUMMARY

In a particular embodiment, a system is disclosed that includes a Built-In Self Test (BIST) circuit configured to test a cache memory. The system further includes a non-volatile storage device including an E-fuse array to store one or more indicators. Each indicator identifies a corresponding memory address of a failed location of the cache memory that has been detected by the BIST circuit.

In another particular embodiment, a method of excluding access to a failed memory cell of a cache memory includes testing a cache memory with a Built-In Self Test (BIST) circuit to identify one or more memory addresses corresponding to failed cache memory cells, and storing in a non-volatile storage device that includes an E-fuse array a corresponding indicator of each memory address that has been identified by the BIST circuit.

In another particular embodiment, a computer-readable medium stores processor-executable instructions that when executed, cause a processor to identify one or more memory addresses of a cache memory that are associated with a failed cache memory cell via a Built-In Self Test (BIST) circuit. The computer-readable medium stores a corresponding indicator of each memory address that has been identified by the BIST in a storage medium comprising an E-fuse array.

One particular advantage provided by at least one of the disclosed embodiments is that use of non-volatile storage, such as an E-fuse array, to store memory addresses of failed memory cells of the cache memory reduces power consumption compared to use of a volatile or refreshable storage device to store the memory addresses of the failed memory cells.

Other aspects, advantages, and features of the present disclosure will become apparent after review of the entire application, including the following sections: Brief Description of the Drawings, Detailed Description, and the Claims.

DETAILED DESCRIPTION

Figure 1:
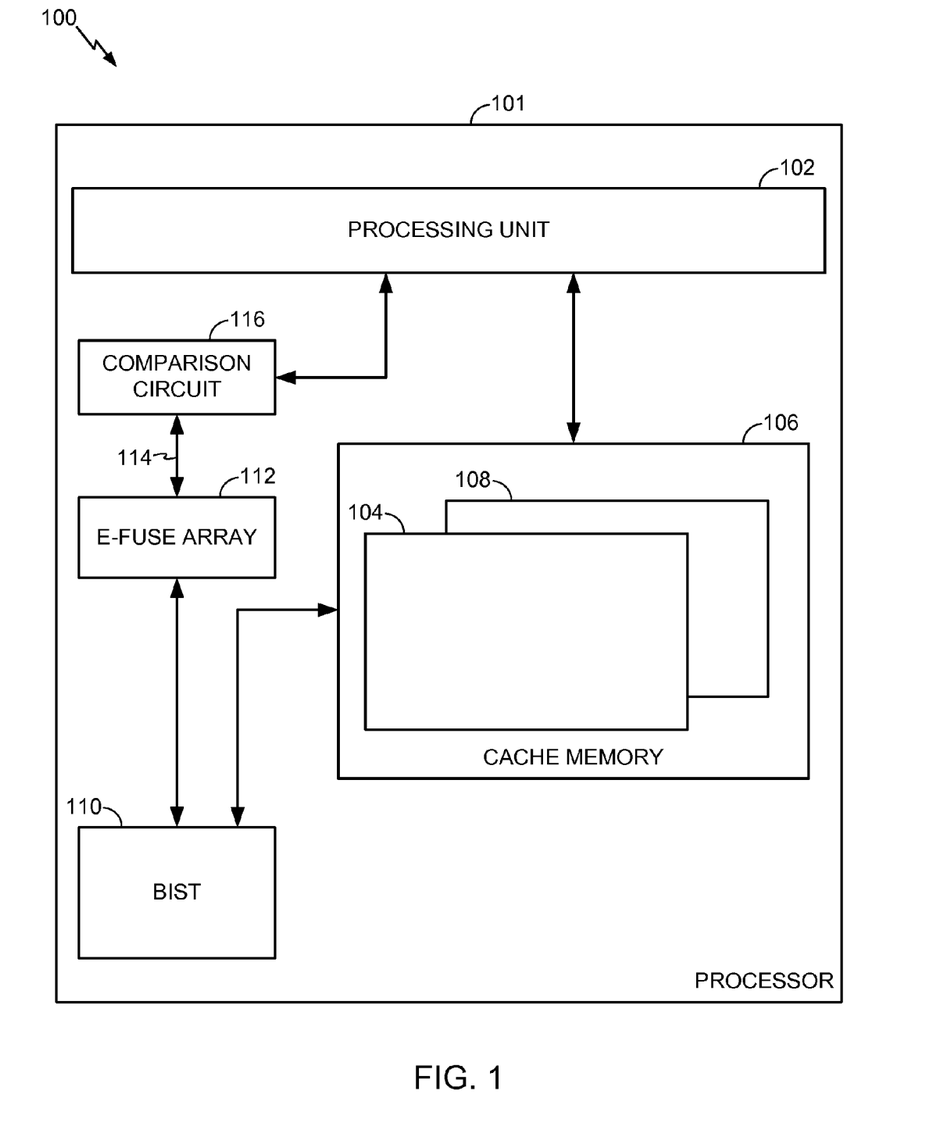
FIG. 1 is a block diagram of a first illustrative embodiment of a system including a resizable cache memory.

FIG. 1 is a block diagram of a system including a resizable cache memory. The system 100 includes a processor 101 that includes a processing unit 102 coupled to a cache memory 106 and a comparison circuit 116. A Built-In-Self-Test (BIST) circuit 110 is coupled to the cache memory 106 and to a non-volatile storage device 112.

The cache memory 106 includes a plurality of blocks, including blocks 104 and 108. The cache memory 106 stores data in cache lines. The cache memory 106 includes multiple bit cells corresponding to each cache line to store data associated with the cache line. In a particular embodiment, the cache memory 106 does not include redundant bit cells. As a result, when a bit cell fails, the corresponding memory location of the cache memory 106 may become unusable as data stored or retrieved from the location will be unreliable.

The BIST 110 is configured to test the cache memory 106 and to locate failed memory locations of the cache memory 106. For example, the BIST 110 may be configured to write test data to memory locations of the cache memory 106 and to evaluate the data read back from the memory locations. The BIST 110 may be configured to provide addresses of failed memory locations of the cache memory 106 to the non-volatile storage device 112.

The non-volatile storage device 112 is configured to store one or more indicators identifying a corresponding memory address of a failed location of the cache memory 106. As illustrated, the non-volatile storage device 112 may include an E-fuse array to store the indicators of the failed locations.

The comparison circuit 116 may be configured to receive at least a portion of a memory address of a memory access request of the cache memory 106 and to compare the received address to the indicators stored at the non-volatile storage device 112. The comparison circuit 116 may be operative to return a signal indicating that the memory address corresponds to a failed location of the cache memory 106 identified by the BIST 110. For example, the comparison circuit 116 may be configured to respond to a memory access request by providing a miss signal in response to detecting a match to one of the indicators stored in the non-volatile memory 112.

The processing unit 102 may configured to communicate data access requests to the cache memory 106 and to receive responses from the cache memory 106. For example, the processing unit 102 may provide an address and data to be stored at the cache memory in response to a WRITE instruction and may receive a reply indicating a success or failure of the write operation at the cache memory 106. As another example, the processing unit 102 may provide an address of data to be read from the cache memory 106 in response to a READ instruction and may receive a reply including data accessed in response to the read request. The processing unit 102 may be configured to communicate with the comparison circuit 116 by providing a memory address associated with a data access request and receiving an indication of whether the memory address corresponds to a failed location of the cache memory 106. In a particular illustrative embodiment, the processing unit 102 is responsive to the comparison circuit 116 to selectively use data returned from the cache memory 106 based on whether the memory address corresponds to a failed location of the cache memory 106.

In operation, the BIST 110 tests bit cells within the cache lines of the cache memory 106. If the BIST 110 determines that a bit cell within a particular cache line is bad, the BIST 110 identifies the address of the particular cache line as a memory address corresponding to a failed memory cell of the cache memory. The BIST 110 sends the memory address or an indicator of the memory address to the non-volatile memory 112, which may record the memory address or indicator by breaking fuses within an E-fuse array, producing a non-volatile stored record of the memory address corresponding to the failed memory cell.

In a particular illustrative embodiment, when a particular cache line of the cache memory 106 is to be addressed during a memory access request (such as a WRITE or READ instruction), the stored memory addresses within the non-volatile memory 112 are compared to a target address of the memory access request by the comparison circuit 116. The comparison circuit 116 accesses the non-volatile memory 112 via an output line 114, compares the target address to the memory addresses stored in the non-volatile memory 112 and responds to the memory access request with a miss signal when a comparison yields a match between the target address and one of the stored memory addresses or stored indicators. When the comparison result is positive, i.e. a match is identified, the memory access request may not be executed.

In another particular illustrative embodiment, the stored memory addresses within the non-volatile memory 112 are compared to the target address only during a WRITE instruction, and not during a READ instruction. If the target address has never been written to, the system 100 will not try to read from the target address.

In a particular embodiment, an effective size of the cache memory 106 is reduced by not addressing the memory addresses within the cache memory whose indicators are stored in the non-volatile memory 112. As a result, an effective size of the cache memory 106 is reduced by the number of indicators stored in the non-volatile memory 112.

In a particular embodiment the cache memory 106 does not include redundant cache lines or data bits, and a memory access request to a memory address of a failed memory cell is not rerouted to a redundant cache line or redundant bits of the cache line. Instead, a call to a memory address corresponding to a failed memory cell of the cache memory results in a miss. The cache memory 106 is reduced in capacity by eliminating access to the cache lines that include failed memory cells and whose memory addresses or indicators are recorded in the non-volatile memory 112. An advantage to eliminating redundant cache lines is that die area that might otherwise be taken up by redundant cache lines is made available to be utilized otherwise. In addition, a cost of manufacture may be reduced by not providing redundant cache lines, re-routing lines and logic circuitry required to utilize the redundant cache lines, or a complex BIST testing algorithm requiring increased testing time.

In another particular illustrative embodiment, the system 100 is configured to have the BIST 110 test the cache memory 106 as part of a power-up sequence. Volatile memory (not shown) can be used instead of the E-fuse array 112 to store indicators of failed locations of the cache memory 106 by storing failed addresses of cache lines that include one or more failed bit cells.

In another particular illustrative embodiment, the system 100 can be configured to evaluate the cache memory 106 operating in a particular mode, such as a low voltage mode. For example, the system 100 can be used to test the cache memory 106 during a power-up sequence in low voltage mode and to resize the cache memory 106 when it is determined that there are one or more failed cache lines.

Figure 2:
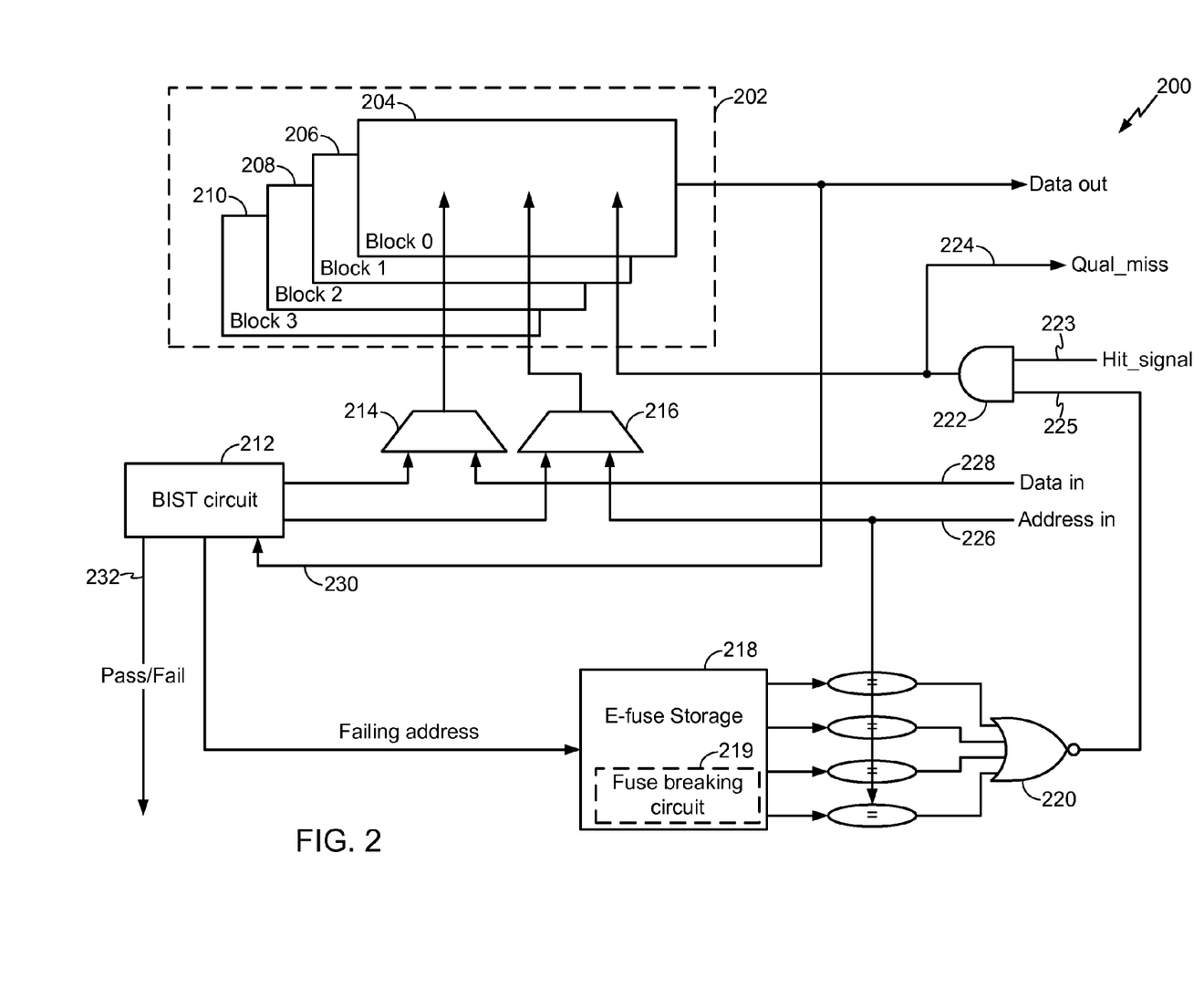
FIG. 2 is a block diagram of a second illustrative embodiment of a system including a resizable cache memory.

FIG. 2 is a block diagram of a second illustrative embodiment of a system 200 including a resizable cache memory. In an illustrative embodiment, elements of the system 200 correspond to elements of the system 100 of FIG. 1. The system 200 includes a cache memory 202 that is coupled to a Built-In-Self-Test (BIST) circuit 212 via a data multiplexer 214 and an address multiplexer 216. The BIST circuit 212 is coupled to an E-fuse storage device (also "E-fuse array" herein) 218, which includes a fuse breaking circuit 219. Comparison circuitry 220 is coupled to the E-fuse array 218 and to an AND circuit 222.

The cache memory 202 includes a first block (Block 0) 204, a second block (Block 1) 206, a third block (Block 2) 208, and a fourth block (Block 3) 210. In a particular embodiment, the representative blocks 204-210 may be used to associate multiple cache lines or "ways" in connection with a particular index to the cache memory 202, such as an n-way set associative cache configuration.

The address multiplexer 216 is coupled to provide an address to the cache memory 202 selected from an address-in line 226 or a value provided by the BIST circuit 212. The data multiplexer 214 is coupled to provide data to the cache memory 202 selected from a data-in line 228 or a value provided by the BIST circuit 212. The address multiplexer 216 and the data multiplexer 214 may be controlled to select inputs from the BIST circuit 212 during a testing operation and to select inputs from the address-in line 226 and the data-in line 224 during normal operation, respectively. The multiplexers 214 and 216 may be controlled via a control input (not shown) responsive to the BIST circuit 212.

The BIST circuit 212 may be configured to test the cache memory 202 and to output indicators of failed locations of the cache memory 202 to the E-fuse array 218. For example, the BIST circuit 212 may be configured to assert a control signal to the multiplexers 214 and 216 and systematically enter test data into memory locations of the cache memory 202 and compare the data read out of the memory locations of the cache memory 202 to the test data. In a particular embodiment, the BIST circuit 212 may be configured to test one or more portions of the cache memory 202, or the entire cache memory 202, in one or more test sequences such as a startup test sequence. The BIST circuit 212 may be configured to provide an indication of a failing address to be written to the E-fuse array 218 and may also provide one or more outputs indicating a success or failure of the test sequence to other devices or systems.

In a particular embodiment, the E-fuse array 218 includes non-volatile memory configured to store a plurality of memory addresses corresponding to failed memory cells of the cache memory 202 or indicators of memory addresses of corresponding failed memory cells of the cache memory 202 (an indicator of a failed memory address is also termed "indicator" herein). For example, the indicator may include at least a portion of the failed address corresponding to a failed memory cell of the cache memory 202. As another example, the indicator may include the memory address corresponding to the failed memory cell of the cache memory 202. In a particular embodiment, the E-fuse array 218 includes a fuse breaking module 219 configured to record the indicator by causing a particular selected fuse or a plurality of fuses corresponding to the memory address associated with the failed memory cell to be broken within the E-fuse array 218. The recorded indicator is non-volatile, i.e., becomes a permanent record in the E-fuse array 218.

In a particular embodiment, the comparison circuitry 220 is configured to receive a memory address provided via the address-in line 226 and to compare the received address to indicators stored at the E-fuse array 218. As illustrated, multiple comparisons may be performed and results of each comparison may be logically combined to generate a signal indicating whether the address matches at least one indicator stored at the E-fuse array 218. As a specific example, the signal may be generated via a multiple-input NOR logic circuit.

In a particular embodiment, the AND circuit 222 receives the signal from the comparison circuitry 220 via an input 225 and a hit signal indicating whether requested data is stored at the cache memory 202 at another input 223. The AND circuit 222 may generate an output signal 224 that has a logic high value when the requested data is stored at the cache and none of the indicators at the E-fuse array 218 match the address of the requested data, i.e., the address of the requested data at the cache memory 202 has not been detected by the BIST circuit 212 as corresponding to a failed memory location. As illustrated, the AND logic circuit 222 may provide the output signal to the cache memory 202 and also as a cache miss signal 224.

In operation, the BIST circuit 212 may test each cache line in a block, such as the first block 204, using the multiplexers 214 and 216 to address each individual cache line or each individual bit cell in a particular cache line. For example, the BIST circuit 212 may test each bit cell in each cache line within the first block 204 and identify a bit cell that is unable to correctly store information as a failed bit cell. When a bit cell within a particular cache line is identified as failed, a memory address associated with the cache line containing the failed bit cell is identified as a failed memory address. For example, each of the cache lines within blocks 204, 206, 208 and 210 may be tested by the BIST logic 212, and each of the individual bit cells within each of the cache lines of the cache memory 202 may be tested. The BIST logic 212 also outputs an indicator of a pass or fail status of each cache line in the cache memory 202 by sending a pass or fail signal output via an output line 232. In a particular illustrative embodiment, the BIST logic 212 evaluates each cache line by receiving data via a data line 230 and comparing the data received to test data input to the cache memory 202 via the multiplexers 214 and 216. The indicator corresponding to a failed cache line is sent to the E-fuse array 218, where the indicator is stored by breaking one or more selected fuses of the E-fuse array, the selected broken fuses associated with the memory address corresponding to the failed memory cell.

After the BIST logic 212 has completed its test of all cache lines of the cache memory 202, the E-fuse array 218 contains a non-volatile mapping of memory addresses corresponding to failed memory cells within the cache memory 202. The system 200 is further configured to prevent a memory access request to a failed memory cell of the cache memory such as a WRITE operation to a target address associated with a failed memory cell. When data is to be written to or read from a target address of the cache memory 202, the target address will be input via the address-in line 226 and data to be written to within the particular cache line will be input via the data-in line 228. The target address of the cache line to be accessed will also be compared to data stored in the E-fuse array 218 by the comparison circuit 220. For example, a WRITE instruction is directed to a particular bit cell or group of bit cells within a particular cache line in cache memory 202, and the comparison circuit 220 compares the address of the corresponding cache line (received from the address-in line 226) to the mapping within the E-fuse array 218. When the comparison yields a positive result, i.e., a match is found, an output of the comparison circuit 220 indicates that the WRITE is not to be executed. The output of the comparison circuit 220 is input via an input 225 to the AND circuit 222. A Hit_Signal input via an input 223 of the AND circuit 222 indicates whether the memory address has resulted in a cache hit, i.e., is stored in the cache memory 202. When the output of the AND circuit indicates that no WRITE is to take place, a miss signal (Qual_miss) is output via the line 224. When the output of the NOR circuit 220 indicates that the target address is good, data provided by the data-in line 228 is written to the bit cell or cells that are addressed via the address-in line 226. In a particular illustrative embodiment, when a WRITE instruction is initiated, if a target address to be written to is identified, through a comparison to stored failed memory addresses or indicators in the E-fuse array 218, as a memory address corresponding to a failed memory cell of the cache memory, the WRITE instruction will not be executed. In a particular illustrative embodiment the system 200 includes logic (not shown) to select a replacement address to replace a failed memory address in a manner that is transparent to software interacting with the system 200.

In a particular illustrative embodiment, the target addresses of WRITE instructions are compared against the mapping of memory addresses stored within the E-fuse array 218. By preventing execution of a WRITE instruction to a failed memory cell, subsequent READ instructions can be executed without concern that data to be read from the cache memory will be incorrect due to a previously executed WRITE instruction to a failed memory cell.

Figure 3:
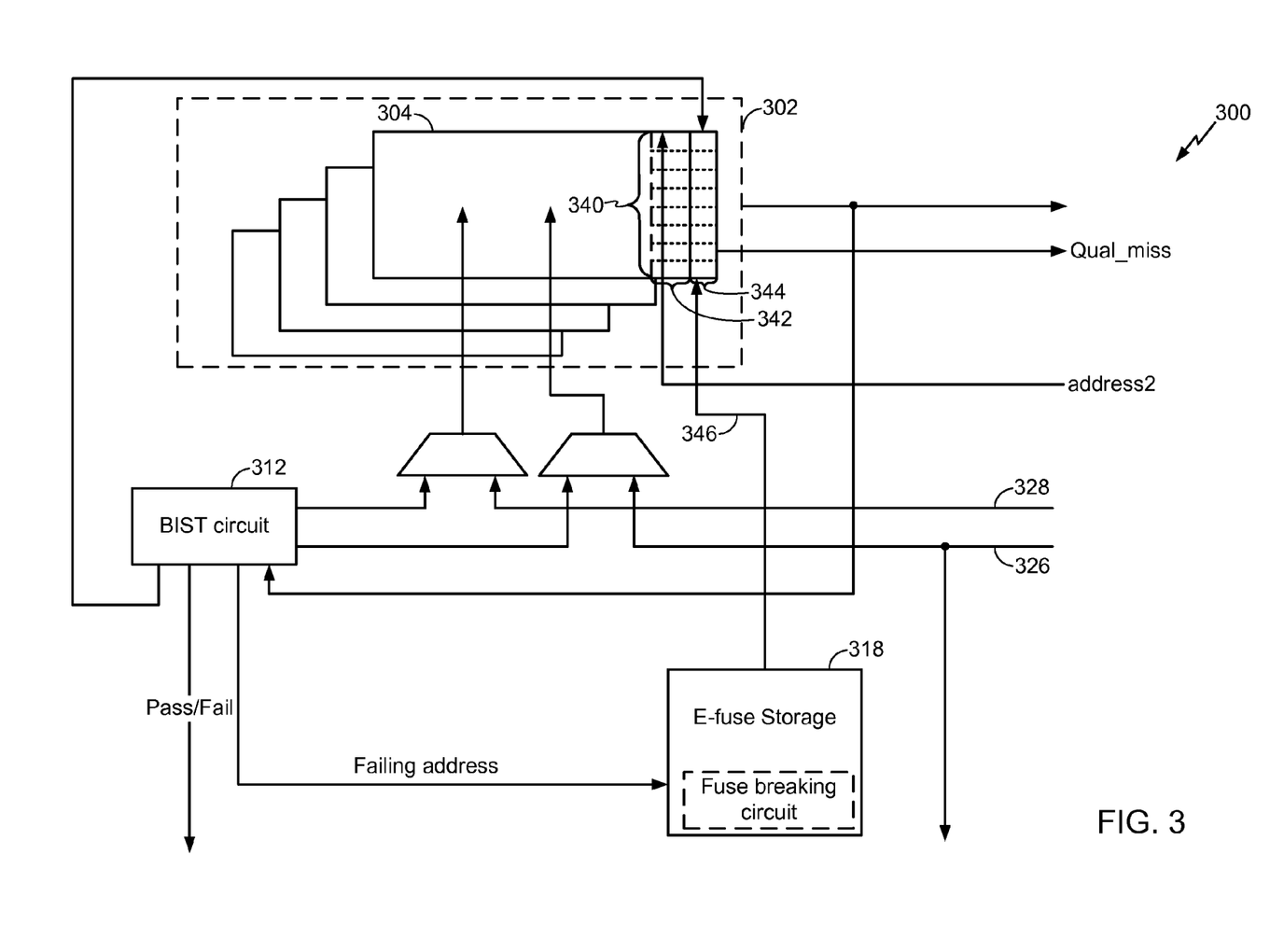
FIG. 3 is a block diagram of a third illustrative embodiment of a system including a resizable cache memory.

FIG. 3 is a block diagram of a third illustrative embodiment of a system to evaluate cache memory and to record memory addresses corresponding to failed memory cells of the cache memory. A system 300 includes a cache memory 302, a BIST circuit 312, and an E-fuse array 318. In a particular embodiment, components of the system 300 correspond to components of the system 100 of FIG. 1, the system 200 of FIG. 2, or any combination thereof.

The cache memory 302 includes a plurality of blocks, such as a representative block 304. A tag array 340 is associated with the block 304. The tag array 340 includes a first tag array portion 342 that stores addresses or portions of addresses of each cache line within the block 304, and a second tag array portion 344 that includes one bit-wide column. In a particular illustrative embodiment, each memory address or portion thereof associated with a failed memory cell of the cache memory 302 in the first tag array portion 342 has a corresponding invalidity value stored in the corresponding one bit-wide cell of the second tag array portion 344.

In a particular illustrative embodiment, information from the E-fuse array 318 is recorded in the second portion 344 of the tag array 340. Each cache line within the block 304 has an associated tag array element 342 that includes an address or portion of an address of the cache line, and an associated state bit within the second tag array portion 344 including validity information indicating whether the cache line is good or bad. The information stored in the second tag array portion 344 is written after conducting the BIST test and recording any memory addresses corresponding to failed memory cells of the cache memory in the E-fuse array 318. An invalidity value is stored in the corresponding bit cell ("state bit" herein) of the second tag array portion 344 and indicates that the corresponding memory address is associated with a failed bit cell within the corresponding cache line.

In a particular illustrative embodiment, tag information is accessed each time a particular cache line is accessed. When a memory access request (READ or WRITE) is encountered, the tag array 340 is accessed in order to determine a validity (i.e., good or failed) of a particular memory address by looking up the associated value stored in the one bit-wide column 344. In a particular illustrative embodiment, the values stored in the column 344 are based on indicators stored in BIST circuit 312. In a particular illustrative embodiment, the one-bit wide column 344 includes resettable storage elements, each having a corresponding element in the E-fuse array 318 that indicates whether the corresponding cache line has failed and is not to be used. In another particular illustrative embodiment, the one-bit wide column 344 includes breakable fuse storage elements, each having a corresponding element in the E-fuse array 318 that indicates whether the corresponding cache line has failed and is not to be used. A particular advantage of the embodiment illustrated in FIG. 3 is quicker access to cache line validity information compared to retrieval of information from the E-fuse array 318. An additional advantage is lower power usage achieved by avoiding use of the comparison circuitry 220 of FIG. 2.

Figure 4:
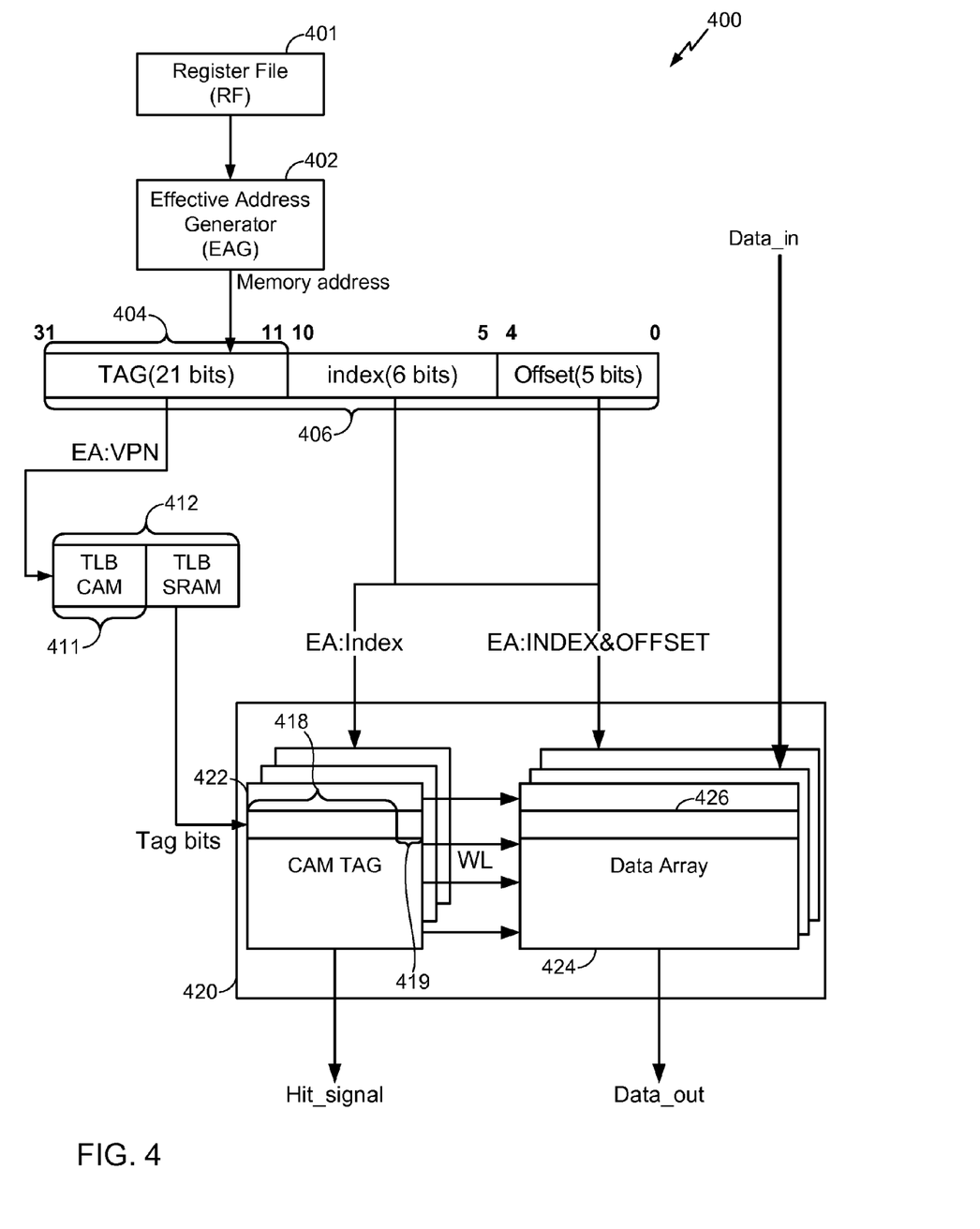
FIG. 4 is a block diagram of a fourth illustrative embodiment of a system including a resizable cache memory.

FIG. 4 is a block diagram of a fourth illustrative embodiment of a system to indicate memory addresses corresponding to failed memory cells of the cache memory. The system 400 includes a register file 401, an effective address generator (EAG) 402, a translation lookaside buffer (TLB) 412, and a cache memory 420. The cache memory 420 includes a content addressable memory array (TLB CAM) 422 and a data array 424.

In a particular embodiment, the register file 401 provides an instruction address to the EAG 402, which produces a virtual memory address 406 including a tag portion 404. The tag portion 404 is input to a content addressable memory tag portion (CAM tag) 411 of the TLB 412. The CAM tag 411 translates the tag portion 404 to a physical tag address that can be compared with tag addresses in the cache memory 420 to locate a matching tag address 418 that corresponds to a cache line 426 in the data array 424. A state bit 419 associated with the tag address 418 can store an invalidity value associated with the cache line 426, indicating whether the cache line 426 is a bad cache line (includes failed bit cells) or is a good cache line (has no failed bit cells).

In operation, a BIST (not shown) can test each cache line within the cache memory 420 and record in an E-fuse array (not shown) a failed cache line address (or indicator) of each bad cache line in the cache memory 420. If, for example, the cache line 426 includes one or more bad bit cells and is determined to be a failed cache line, an invalidity value, indicating a failed cache line, is written to the corresponding state bit 419. When a READ or WRITE instruction targets the failed cache line 426, the state bit 419 is read to determine that the cache line 426 is a failed cache line, the READ or WRITE instruction will not be executed and a miss will be returned.

Figure 5:
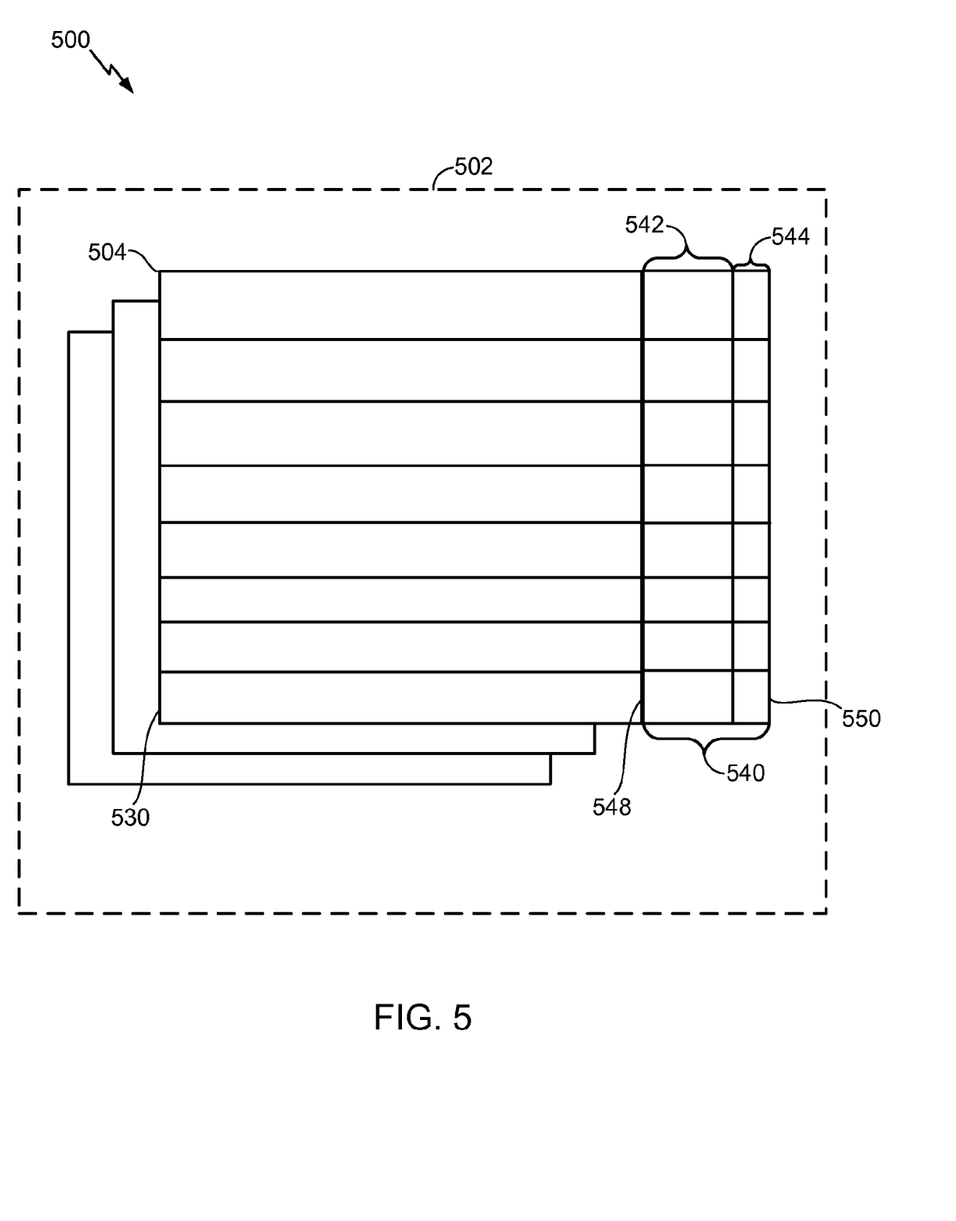
FIG. 5 is a block diagram of an illustrative embodiment of a system to indicate memory addresses corresponding to failed memory cells of a cache memory.

FIG. 5 a block diagram of an illustrative embodiment of a system to indicate memory addresses corresponding to failed memory cells of a cache memory. The system 500 includes cache memory 502. The cache memory 502 includes a plurality of blocks, such as a representative block 504. The block 504 includes a plurality of cache lines and also includes a tag array 540. The tag array 540 includes a first tag array portion 542 that includes address information associated with corresponding cache lines. For example, a representative cache line 530 has a corresponding tag array element 548 that includes address information associated with a cache line 530. A second tag array portion 544 includes information pertaining to validity or invalidity of each cache line.

In a particular illustrative embodiment, the information in the second tag array portion 544 is retrieved from an E-fuse array (not shown) that includes stored indicators of memory addresses corresponding to failed memory cells of the cache memory that have been identified by Built-In Self Test (BIST) logic (not shown). For example, if the BIST logic performs a test on cache line 530 and determines the cache line 530 is bad, an indicator of the memory address associated with the failed memory cell of the cache memory is stored into E-fuse array, and an invalid value is written in a corresponding bit cell 550. In a particular illustrative embodiment, the second tag array portion 544 is one bit wide.

In another embodiment, the second tag array portion 544 includes a column of E-fuse elements. An E-fuse element may be broken when it is determined that the cache line associated with the E-fuse element is no longer usable, i.e., has more failed bit cells than available redundant bits. For example, in an embodiment where the cache memory 502 includes a single redundant bit for each cache line, the E-fuse element may be broken when two or more failed bit cells are identified in the cache line. In another particular illustrative embodiment, the cache memory 502 does not include redundant bits, and the E-fuse element is broken when any data bit in a corresponding cache line is identified as failed. A size of the cache memory 502 (e.g., number of good cache lines) may be reduced by a number of broken E-fuse elements in the second tag array portion 544.

During operation, each of the cache lines in block 504 has a corresponding address entry within the first tag array portion 542 including address information of the cache line, and a corresponding invalidity entry within the second tag array portion 544 indicating validity or invalidity of the cache line. When a memory access request to the cache line 530 is encountered a first tag array cell 548 can be used to locate the cache line 530 and the validity or invalidity of the cache line 530 can be determined from a second tag array cell 550. If it is determined from the second tag array cell 550 that the cache line 530 contains a bad bit cell, a miss will be returned and the command will not be executed.

Figure 6:
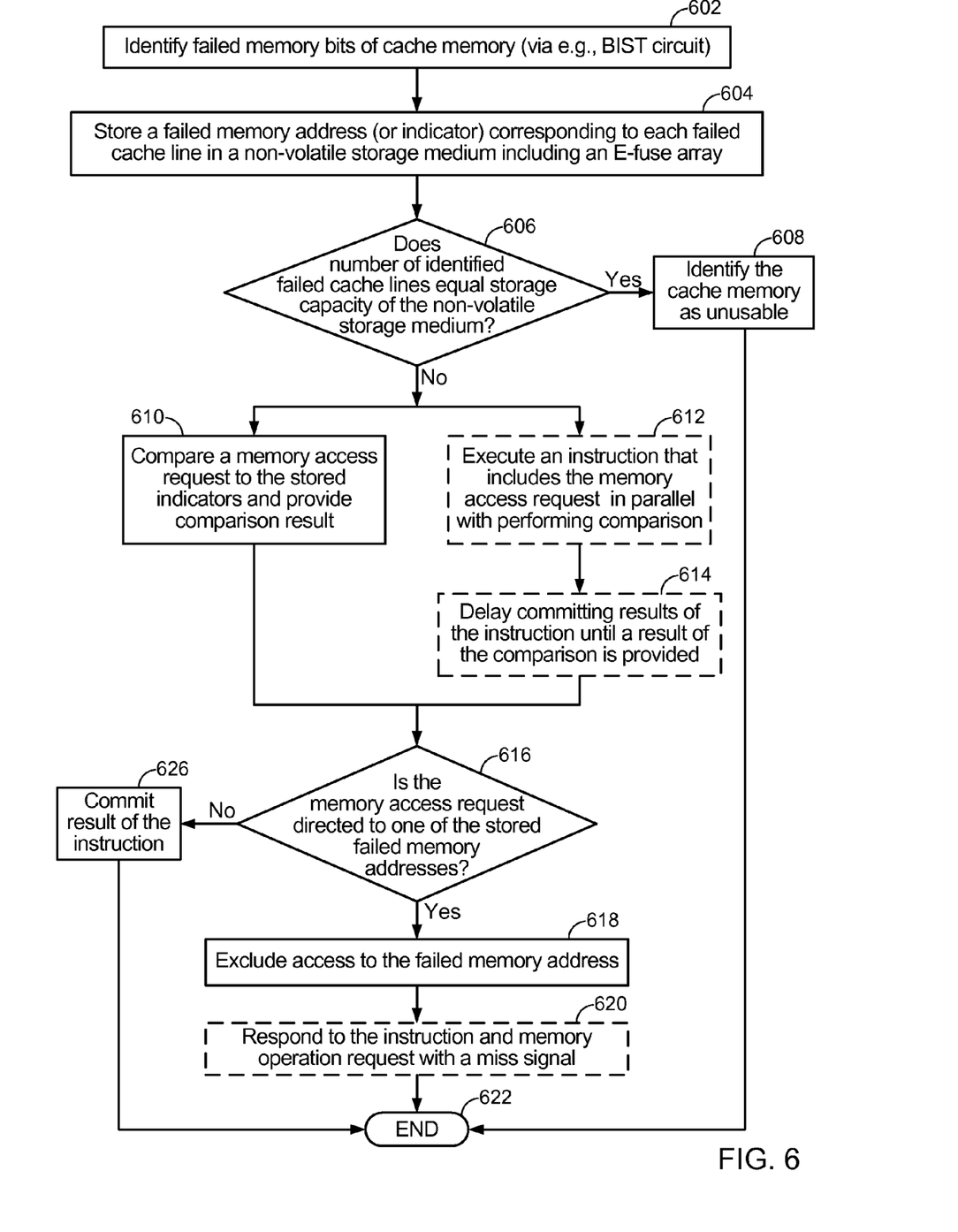
FIG. 6 is a flow chart of a particular illustrative embodiment of a method of evaluating cache memory and recording memory addresses corresponding to failed memory cells of the cache memory.

FIG. 6 is a flow chart of a particular illustrative embodiment of a method of evaluating cache memory and recording memory addresses corresponding to failed memory cells of the cache memory. At block 602, one or more failed memory bit cells of a cache memory are identified via a Built-In-Self-Test (BIST) circuit. Moving to block 604, a memory address associated with a failed memory cell of the cache memory or indicator of a failed memory cell is stored in a non-volatile storage device that includes an E-fuse array. Proceeding to decision block 606, when the number of failed cache memory addresses is equal to a storage capacity of the non-volatile storage device, the method proceeds to block 608 where the cache memory is identified as unusable, and the method terminates at 622. For example, where the number of failed memory address stored at the E-fuse array 218 of FIG. 2 equals the total available number of elements of the E-fuse array 218, the cache memory 202 may be identified as unusable. In another particular illustrative embodiment (not shown) the cache memory 202 may be identified as unusable when all E-fuse elements have been used and another cache line is determined to have failed. In another particular illustrative embodiment (not shown), the cache memory is determined to be unusable based on a number of failed cache lines or based on a number of useable cache lines.

Returning to block 606, when the number of identified failed cache lines does not exceed a storage capacity of the non-volatile medium, a comparison of a target address of a memory access request with the stored indicators such as failed memory addresses or portions thereof produces a comparison result, at 610. For instance, when a WRITE command is addressed to a particular memory address, the particular memory address is compared with the stored indicators in the E-fuse array and a comparison result is output.

Optionally, at block 612 an instruction that includes the memory access request of block 610 is executed in parallel with performing the comparison to the memory addresses stored in the non-volatile storage device of block 610. Moving to block 614, optionally a result of the instruction is delayed until a result of the comparison at block 610 is provided.

Proceeding to decision block 616, a determination is made whether the memory access request of block 610 is directed to one of the stored memory addresses or indicators thereof. If the memory access request is not directed to one of the memory addresses corresponding to failed memory cells of the cache memory, proceeding to block 626 the result of the instruction executed at block 612 is committed, i.e., the result is accepted. For example, when the instructions include a WRITE command, the WRITE to the target address of the memory access request is executed, and the method ends at 624.

At block 616, if the memory access request of block 610 is directed to one of the memory addresses stored in the non-volatile storage medium, the method proceeds to block 618 and access to the memory address is excluded. Proceeding to block 620, the instruction and memory operation request is responded to with a "miss" signal. The method ends at 622.

An advantage provided by the systems and methods presented in FIGS. 1-6 can include time efficiency by avoiding WRITE access and/or READ access to failed memory addresses. In a particular illustrative embodiment, another advantage is that redundant cache lines are not included in the cache memory. Eliminating redundant cache lines can reduce the physical size of cache memory. In a particular illustrative embodiment, when it is determined that a number of failed memory cells within a cache memory exceeds a pre-determined threshold number, then the cache memory is determined to be unusable.

E-fuse storage can provide an energy efficient technique to store failed memory addresses because, once written, no additional energy is required to maintain or refresh information stored in the E-fuse array. Power needs are thus reduced in comparison with storage via a volatile storage medium or a refreshable storage medium.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A system comprising:
a processor comprising:
   a cache memory;
   a Built-In Self Test (BIST) circuit configured to test the cache memory;
   a non-volatile storage device comprising an E-fuse array to store one or more indicators, wherein each indicator identifies a corresponding memory address of a failed location of the cache memory that has been detected by the BIST circuit, wherein an accessible size of the cache memory is reduced by excluding access to each memory address of the cache memory identified by a corresponding indicator stored in the E-fuse array, and wherein the cache memory is identified as unusable when a count of the indicators stored in the non-volatile storage device exceeds a threshold;
   a comparison circuit coupled to the non-volatile storage device, wherein the comparison circuit is configured to perform a comparison of a memory access request with the one or more indicators in the E-fuse array; and
   a processing unit to:
      execute a portion of an instruction in parallel with the comparison, wherein the instruction includes the memory access request; and
      delay committing results of the instruction until the comparison is performed.

2. The system of claim 1, wherein the comparison circuit is further configured to generate a failure signal in response to a match produced by the comparison when the memory access request is directed to a particular memory address of a failed location of the cache memory.

3. The system of claim 2, wherein the comparison circuit responds to the memory access request by providing a miss signal in response to the match, and wherein the miss signal prevents execution of the memory access request at the cache memory.

4. The system of claim 2, wherein the memory access request is a write request.

5. The system of claim 1, wherein each indicator is stored in the E-fuse array by breaking one or more corresponding fuses within the E-fuse array.

6. The system of claim 5, further comprising a fuse breaking module configured to cause the one or more corresponding fuses to be broken.

7. The system of claim 1, further comprising a tag array configured to store a tag indicator corresponding to each of the one or more indicators of failed locations of the cache memory.

8. The system of claim 1, wherein the cache memory further includes redundant bit cells.

9. The system of claim 1, wherein each indicator includes at least a portion of the corresponding memory address of the failed location of the cache memory.

10. The system of claim 1, wherein the threshold corresponds to a capacity of the E-fuse array.

11. A method of excluding access to a failed memory cell of a cache memory, the method comprising:
  testing a cache memory with a Built-In Self Test (BIST) circuit to identify one or more memory addresses corresponding to failed cache memory cells;
  storing, in a non-volatile storage device comprising an E-fuse array, a corresponding indicator of each of one or more memory addresses identified by the BIST circuit;
  performing a comparison of a first memory address with the one or more memory addresses identified by the corresponding stored indicators, wherein the first memory address is associated with a memory access request;
  executing a portion of an instruction in parallel with performing the comparison, wherein the instruction includes the memory access request, and wherein committing results of the instruction is delayed until the comparison is performed; and
  preventing execution of the memory access request at the cache memory when the comparison indicates that the one or more memory addresses match the first memory address.

12. The method of claim 11, further comprising responding to the memory access request with a miss signal when the comparison indicates that the one or more memory addresses includes the first memory address.

13. The method of claim 11, further comprising identifying the cache memory as unusable when a count of indicators stored in the non-volatile storage device exceeds a threshold.

14. The method of claim 11, further comprising identifying the cache memory as unusable when a count of indicators stored in the non-volatile storage device exceeds a capacity associated with the non-volatile storage device.

15. The method of claim 11, further comprising:
  entering an invalidity value into a corresponding tag array bit cell of each memory address having a corresponding stored indicator; and
  preventing execution of a memory access request to a first memory address when the tag array bit cell of the first memory address contains the invalidity value.

16. A non-transitory computer-readable medium storing processor-executable instructions that, when executed by a processor, cause the processor to:
  identify one or more memory addresses of a cache memory that are associated with a failed memory cell via a Built-In Self Test (BIST) circuit, the BIST circuit being included in the processor;
  store corresponding indicators of memory addresses identified by the BIST in a storage medium comprising an E-fuse array;
  generate a cache miss signal in response to receiving a memory access request directed to a memory address having a corresponding indicator in the E-fuse array; and
  identify the cache memory as unusable when a count of the indicators in the E-fuse array exceeds a threshold, wherein the threshold corresponds to a capacity of the E-fuse array.

17. The non-transitory computer-readable medium of claim 16, further comprising instructions executable by the processor to:
  perform a comparison of a memory access request with the indicators in the E-fuse array;
  execute a portion of an instruction in parallel with performing the comparison, wherein the instruction includes the memory access request; and
  delay committing results of the instruction until the comparison is performed.

* * * * *